(12) United States Patent
Yan et al.

(10) Patent No.: US 11,451,236 B2
(45) Date of Patent: Sep. 20, 2022

(54) METASTABILE STATE DETECTION DEVICE AND METHOD, AND ADC CIRCUIT

(71) Applicant: RIGOL TECHNOLOGIES CO., LTD., Jiangsu (CN)

(72) Inventors: Bo Yan, Suzhou (CN); Junzhou Luo, Suzhou (CN); Yue Wang, Suzhou (CN); Tiejun Wang, Suzhou (CN); Weisen Li, Suzhou (CN)

(73) Assignee: RIGOL TECHNOLOGIES CO., LTD., Jiangsu (CN)

( * ) Notice: Subject to any disclaimer, the term of this patent is extended or adjusted under 35 U.S.C. 154(b) by 0 days.

(21) Appl. No.: 17/276,027

(22) PCT Filed: May 9, 2020

(86) PCT No.: PCT/CN2020/089478
§ 371 (c)(1),
(2) Date: Mar. 12, 2021

(87) PCT Pub. No.: WO2021/128701
PCT Pub. Date: Jul. 1, 2021

(65) Prior Publication Data
US 2022/0109450 A1 Apr. 7, 2022

(30) Foreign Application Priority Data

Dec. 26, 2019 (CN) .......................... 201911366573.5

(51) Int. Cl.
*H03M 1/10* (2006.01)
*H03L 7/081* (2006.01)

(52) U.S. Cl.
CPC .......... *H03M 1/1076* (2013.01); *H03L 7/081* (2013.01); *H03M 1/1014* (2013.01)

(58) Field of Classification Search
CPC .... H03M 1/1076; H03M 1/1014; H03M 1/12; H03M 1/0863; H03M 1/462; H03L 7/081
See application file for complete search history.

(56) References Cited

U.S. PATENT DOCUMENTS 5,122,694 A * 6/1992 Bradford ................ G01R 13/32
327/198
7,430,141 B2 * 9/2008 Bonelli ................ G11C 7/1093
365/233.5
(Continued)

FOREIGN PATENT DOCUMENTS

CN 103095289 A 5/2013
CN 105187053 A 12/2015
(Continued)

OTHER PUBLICATIONS

Chinese Office Action dated Aug. 12, 2020 issued in corresponding Patent Application No. 201911366573.5 (8 pages).
(Continued)

*Primary Examiner* — Lam T Mai
(74) *Attorney, Agent, or Firm* — Polsinelli PC

(57) ABSTRACT

A metastable state detection device and method, and an ADC circuit are disclosed. The metastable state detection device includes: a delay unit which is configured to receive a synchronization signal and delay the synchronization signal based on preset step delay values; a first flip-flop unit including a first clock input terminal, a first data input terminal and a first data output terminal, wherein the first clock input terminal is configured to receive a clock signal; the first data input terminal is configured to receive the delayed synchronization signal; a second flip-flop unit including a second clock input terminal, a second data input terminal and a second data output terminal; a processing module connected to the second data output terminal, which
(Continued)

is configured to receive a target clock signal and detect a metastable state of the first flip-flop unit according to the target clock signal.

18 Claims, 5 Drawing Sheets

(56) References Cited

U.S. PATENT DOCUMENTS

| | | | | |
|---|---|---|---|---|
| 8,487,680 | B1* | 7/2013 | Chung | H03K 5/1565 327/175 |
| 8,872,691 | B1 | 10/2014 | Stepanovic | |
| 8,957,802 | B1 | 2/2015 | Evans | |
| 9,634,680 | B1 | 4/2017 | Ray et al. | |
| 10,715,124 | B2* | 7/2020 | Zhang | H03K 3/013 |
| 10,812,057 | B1* | 10/2020 | Chou | H03L 7/085 |
| 10,848,140 | B1* | 11/2020 | Joshi | H03K 5/19 |
| 10,928,447 | B2* | 2/2021 | Chou | G01R 31/31709 |
| 10,999,050 | B1* | 5/2021 | Agarwal | H04L 7/0041 |
| 11,042,126 | B2* | 6/2021 | Yuan | G04F 10/005 |
| 2005/0141294 | A1* | 6/2005 | Bonelli | G11C 7/1093 365/193 |
| 2008/0285699 | A1* | 11/2008 | Jang | G11C 7/1078 375/376 |
| 2014/0211893 | A1 | 7/2014 | Rasouli et al. | |
| 2015/0214970 | A1 | 7/2015 | Fan et al. | |
| 2017/0005782 | A1* | 1/2017 | Im | H04L 7/048 |
| 2018/0267480 | A1* | 9/2018 | Mahajan | G04F 10/005 |
| 2020/0091901 | A1* | 3/2020 | Zhang | H03K 5/1252 |
| 2020/0132764 | A1* | 4/2020 | Chou | H03L 7/0812 |
| 2021/0173009 | A1* | 6/2021 | Chou | G01R 31/31724 |

FOREIGN PATENT DOCUMENTS

| | | |
|---|---|---|
| CN | 106537786 A | 3/2017 |
| CN | 109032498 A | 12/2018 |
| CN | 109150182 A | 1/2019 |
| CN | 109995359 A | 7/2019 |
| CN | 110311659 A | 10/2019 |
| CN | 110401444 A | 11/2019 |
| JP | 1993-264602 A | 10/1993 |
| JP | 2002-107381 A | 4/2002 |
| JP | 2012-244521 A | 12/2012 |
| PL | 407108 A1 | 8/2015 |

OTHER PUBLICATIONS

International Search Report dated Sep. 4, 2020 issued in corresponding parent application PCT/CN2020/089478 (4 pages).
Written Opinion dated Sep. 4, 2020 issued in corresponding parent application PCT/CN2020/089478 (3 pages).
International Search Report dated Sep. 4, 2020 issued in parent Application No. PCT/CN2020/089478, English Translation (2 pages).
Written Opinion dated Sep. 4, 2020 issued in parent Application No. PCT/CN2020/089478, English Translation (2 pages).
Japanese Office Action dated May 27, 2022 issued in corresponding Patent Application No. 2021-518702 w/Machine Translation (8 pages).

* cited by examiner

METASTABILE STATE DETECTION DEVICE AND METHOD, AND ADC CIRCUIT

CROSS REFERENCE TO RELATED APPLICATIONS

This application is a National Stage application of PCT international application PCT/CN2020/089478, filed on May 9, 2020 which claims priority to Chinese patent application No. 201911366573.5, entitled "Metastable state detection device and method, and ADC circuit", filed before the China National Intellectual Property Administration on Dec. 26, 2019, both of which are incorporated herein by reference in their entireties.

TECHNICAL FIELD

The present disclosure relates to a digital or digital-analog hybrid integrated circuit, and in particular to a metastable state detection device and method, and an ADC circuit.

BACKGROUND

In a digital or digital-analog hybrid integrated circuit, a flip-flop is widely used as a high-speed storage memory element in a modern IT hardware circuit and system. In order to achieve reliable storage of input data, it is required for a setup time region and a hold time region of the input data to remain constant before and after a rising edge of a clock. In a synchronous system, if a setup/hold time of a flip-flop does not satisfy this, a metastable state may occur. In this case, an output Q of the flip-flop will be in an uncertain state for a relatively long period after an effective clock edge. During this period of time, there is a burred, oscillated, and fixed voltage value at the Q terminal which is not equal to the value of the data input terminal D.

Traditionally, the metastable state of the flip-flop can be detected only by setting a detector with a same frequency as the clock. However, the design of such a detector is complicated and costly.

SUMMARY

In view of this, it is necessary to provide a metastable state detection device and method, and an ADC circuit for solving the above problem, which can simplify the structure of the detection device and have a low cost.

A metastable state detection device comprises:

a delay unit which is configured to receive a synchronization signal and delay the synchronization signal;

a first flip-flop unit including a first clock input terminal, a first data input terminal and a first data output terminal, wherein the first clock input terminal is configured to receive a clock signal; the first data input terminal is connected to the delay unit and is configured to receive the delayed synchronization signal;

a second flip-flop unit including a second clock input terminal, a second data input terminal and a second data output terminal, wherein the second clock input terminal is respectively connected to the delay unit and the first data input terminal and is configured to receive the delayed synchronization signal; the second data input terminal is connected to the first clock input terminal and is configured to receive a clock signal; the second data output terminal is configured to output a target clock signal that is synchronized with the delayed synchronization signal;

a processing module connected to the second data output terminal, which is configured to receive the target clock signal and detect a metastable state of the first flip-flop unit according to the target clock signal.

In one of the embodiments, both of the first flip-flop unit and the second flip-flop unit are D flip-flops.

In one of the embodiments, the first flip-flop unit includes a first inverter and a first JK flip-flop, and a J terminal of the first JK flip-flop is connected to a K terminal of the first JK flip-flop via the first inverter;

The second flip-flop unit includes a second inverter and a second JK flip-flop, and a J terminal of the second JK flip-flop is connected to a K terminal of the second JK flip-flop via the second inverter.

In one of the embodiments, the processing module comprises:

a reading unit connected to the second data output terminal, which is configured to read the target clock signal;

a controller respectively connected to the reading unit and the delay unit, which is configured to detect the metastable state of the target clock signal, and obtain a calibration delay value for calibrating the metastable state according to the target clock signal, and is also configured to control the delay unit to delay the synchronization signal with the calibration delay value.

The present application also provides an ADC circuit comprising: the above mentioned metastable state detection device.

In one of the embodiments, the ADC circuit further includes:

a clock module which is configured to output a clock signal;

a synchronization signal module which is configured to output a synchronization signal;

wherein, an input terminal of the delay unit is connected to the synchronization signal module, and an output terminal of the delay unit is respectively connected to the first data input terminal and the second clock terminal; the first clock input terminal, the second data input terminal and the first data output terminal are respectively connected to the clock generating module.

In one of the embodiments, the clock module includes:

a clock generating unit which is respectively connected to the first clock input terminal and the second data input terminal and is configured to generate the clock signal;

a frequency dividing unit which is respectively connected to the clock generating unit and the first data output terminal, and is configured to perform a frequency dividing processing on the target synchronization signal output from the first flip-flop unit.

The present application also provides a metastable state detection method, wherein the detection method is applicable to a metastable state detection device, and wherein the metastable state detection device includes a delay unit, a first flip-flop unit, and a second flip-flop unit, wherein a clock input terminal of the first flip-flop unit is connected to a data input terminal of the second flip-flop unit, both of which are configured to receive a clock signal, and wherein a data input terminal of the first flip-flop unit and a clock input terminal of the second flip-flop unit are respectively connected to the delay unit, both of which are configured to receive a delayed synchronization signal; wherein, the method includes:

controlling the delay unit to delay the received synchronization signal based on preset delay values;

recording target clock signals from the second flip-flop unit in correspondence with each of the delay values;

detecting a metastable state of the first flip-flop unit according to the recorded correspondence relationships between the delay values and the target clock signals.

In one of the embodiments, the detecting a metastable state of the first flip-flop unit according to the recorded correspondence relationships between the delay values and the target clock signals includes:

recording a target clock signal output from the second flip-flop unit, when a rising edge/or falling edge of the delayed synchronization signal being input to the second flip-flop unit as a triggering edge;

obtaining a delay value within a setup/hold time window according to the recorded target clock signal;

using a clock signal that is output in correspondence with the delay value within the setup/hold time window as the metastable state of the first flip-flop unit.

In one of the embodiments, the method further includes: calibrating the metastable state of the first flip-flop unit.

In one of the embodiments, the calibrating the metastable state of the first flip-flop unit includes:

obtaining a delay value within a window where logic "1" is transitioned to logic "0" according to the recorded target clock signal;

taking the delay value within the window where logic "1" is transitioned to logic "0" to be a calibration value;

controlling the delay unit to delay the synchronization signal with the calibration value.

In one of the embodiments, when there are a plurality of calibration values, a minimum calibration value of the plurality of calibration values is selected to be a target calibration value.

In one of the embodiments, the method further comprises:

detecting if a clock mode of the clock signal has been changed;

when the clock mode has been changed, recalibrating the metastable state of the first flip-flop unit.

In the above-mentioned metastable state detection device and method, and an ADC circuit, the second data input terminal of the second flip-flop unit is connected to the first clock input terminal of the first flip-flop unit, and the second clock input terminal of the second flip-flop unit is connected to the first data input terminal of the first flip-flop unit. As such, the second data output terminal of the second flip-flop unit can be used as a metastable state detection terminal of the first flip-flop unit to detect the metastable state of the first flip-flop unit, which involves a simple structure and a high detection accuracy.

BRIEF DESCRIPTION OF THE DRAWINGS

In order to explain the embodiments of the present disclosure or the technical solutions in the prior art more clearly, drawings to be used to describe of these embodiments or the prior art will be briefly introduced below. Obviously, the drawings in the following description are merely some embodiments of the present disclosure, and those of ordinary skill in the art can obtain drawings of other embodiments based on these drawings without creative effort.

DETAILED DESCRIPTION

In order to facilitate the understanding of the present disclosure, and to make the above-mentioned objects, features and advantages of the present disclosure more obvious and understandable, the specific embodiments of the present disclosure will be described in detail below with reference to the accompanying drawings. In the following description, many specific details are set forth such that the present disclosure can be fully understood. Preferred embodiments of the present disclosure are provided in the accompanying drawings. However, the present disclosure can be implemented in many different forms and is not limited to the embodiments described herein. On the contrary, these embodiments are provided to such that the disclosure of the present disclosure will be more thorough and complete. The present disclosure can be implemented in many other ways that are different from those described herein, and those skilled in the art can make similar improvements without departing from the connotation of the present disclosure. Therefore, the present disclosure is not limited by the specific embodiments disclosed below.

In addition, the terms "first" and "second" are only used for the purpose of description, and should not be understood to indicate or imply relative importance of the indicated technical features or to implicitly indicate the number of them. Therefore, the features limited with "first" and "second" may explicitly or implicitly include at least one of the features. In the description of the present disclosure, "a plurality of" refers at least two, such as two, three, etc., unless expressly limited otherwise. In the description of the present disclosure, "several" refers at least one, such as one, two, etc., unless expressly limited otherwise.

Figure 1:
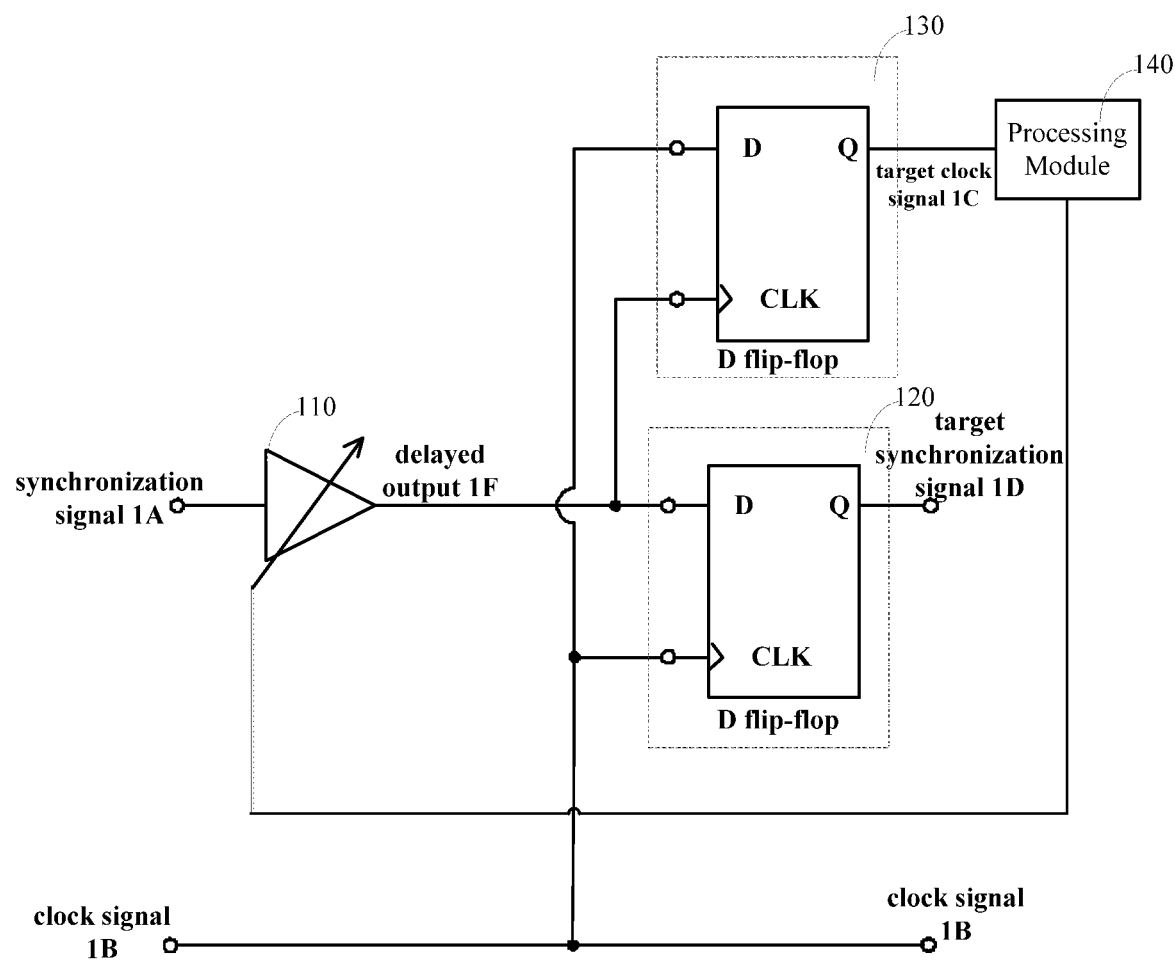
FIG. 1 is a circuit schematic of a metastable state detection device in an embodiment.

As shown in FIG. 1, an embodiment of the present application provides a metastable state detection device. In one of the embodiments, the metastable state detection device includes a delay unit 110, a first flip-flop unit 120, a second flip-flop unit 130, and a processing module 140.

An input terminal of the delay unit 110 is configured to receive a synchronization (SYNC) signal 1A. The delay unit 110 receives the synchronization signal 1A, and can delay the synchronization signal 1A. The delay unit 110 can perform a corresponding delay on the received synchronization signal 1A.

In one of the embodiments, the delay unit 110 may include a register or a counter. In an embodiment of the present application, the delay unit 110 may be a register, which is referred to as DSYNC. Control bits of the register can be set as <M−1:0>, wherein M represents the number of the control bits of the register, <M−1:0> represents that there are M control bits and 2^M register values in total. When the control value is 0, the delay value used by the delay unit 110 to perform a delay processing on the synchronization signal 1A is Td<1>; when the control value is 1, the delay value used by the delay unit 110 to perform a delay processing on the synchronization signal 1A is Td<2>, and so on. When the control value is M−1, the delay value used by the delay unit 110 to perform a delay processing on the synchronization signal 1A is Td<M>. At the same time, each delay value used by the delay unit 110 to perform a delay processing on the synchronization signal 1A is set according to a preset step. The delay value Td<1> is less than the delay value Td<2>, and the delay value Td<2> is less than the delay value Td<3>. For example, Td<1><Td<2>< . . . <Td<M−1><Td<M>.

It should be noted that the difference between any two adjacent delay values is the same. That is, Td<2>−Td<1>=Td<M>−Td<M−1>. Optionally, the difference between any two adjacent delay value may not the same. In the present disclosure, the difference between two adjacent delay values is not further limited.

The first flip-flop unit 120 includes a first clock input terminal, a first data input terminal, and a first data output terminal. The second flip-flop unit 130 includes a second clock input terminal, a second data input terminal, and a second data output terminal. The first clock input terminal of the first flip-flop unit 120 and the second data input terminal of the second flip-flop unit 130 are connected with each other, both of which are configured to receive a clock signal 1B. The first data input terminal of the first flip-flop unit 120 and the second clock input terminal of the second flip-flop unit 130 are both connected to the delay unit 110, both of which are configured to receive a synchronization signal 1A that has been delayed by the delay unit 110.

The first flip-flop unit 120 can synchronize the delayed synchronization signal 1A with the clock signal 1B such that the first data output terminal outputs a target synchronization signal 1D that is synchronized with the clock signal 1B.

Since the second data input terminal of the second flip-flop unit 130 is connected to the first clock input terminal of the first flip-flop unit 120, and the second clock input terminal of the second flip-flop unit 130 is connected to the first data input terminal of the first flip-flop unit 120, the synchronization signal 1A can be used as a sampling clock, and the clock signal 1B can be used as a data signal. That is, the high frequency clock signal 1B can be sampled with the low frequency synchronization signal 1A, such that the second data output terminal of the second flip-flop unit 130 can output a target clock signal 1C that is synchronized with the delayed synchronization signal 1A to recover the clock signal 1B. That is, the second data output terminal of the second flip-flop unit 130 can be used as a metastable state detection terminal.

The processing module 140 is connected to the second data output terminal, and is configured to receive the target clock signal 1C, and detect a metastable state of the first flip-flop unit 120 according to the target clock signal 1C. The metastable state means that a flip-flop cannot reach a confirmable state within a prescribed period of time. The setup time and hold time of the flip-flop define a time window around a clock rising edge. If a data signal at a data input terminal of the flip-flop is changed (or the data is updated) within the time window, a timing violation will be generated, and thus a metastable state will occur.

Figure 2:
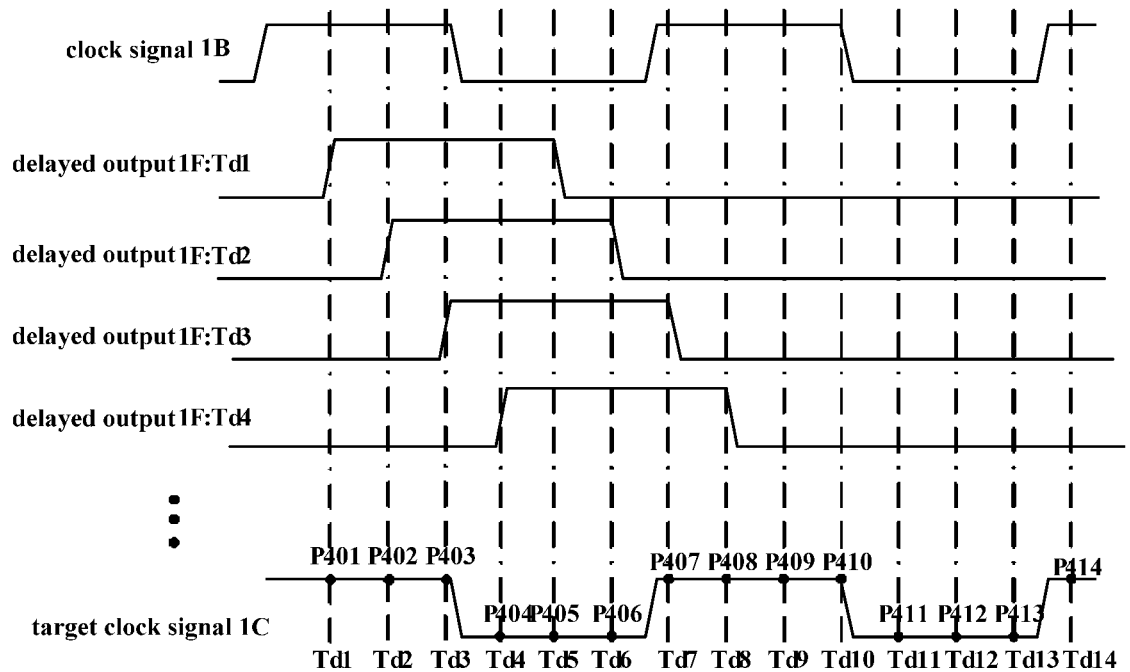
FIG. 2 is a timing chart related to a metastable state detection device in an embodiment.

As an example, when the delay unit 110 performs a delay processing on the synchronization signal 1A, the processing module 140 may obtain a level signal of a corresponding target clock signal 1B output from the second data output terminal of the second flip-flop unit 130 (which can be corresponding to a recorded delay value such as Td<1>, Td<2>, . . . , <Td<14> as shown in FIG. 2) and a level signal of a corresponding target clock signal 1C output from the second data output terminal of the second flip-flop unit 130 (P401, P402, P403, . . . , P414, and etc. as shown in FIG. 2) for each delay value. When rising edge of the synchronization signal 1A that has been delayed by the delay unit 110 is used as triggering edge of the second flip-flop unit 130, a correspondence relationship between the target clock signal 1C and the delay value can be obtained. The point where the first flip-flop unit 120 presents a metastable state can be detected according to the correspondence relationship. As shown in FIGS. 2, P407 and P414 are the points where the metastable state is most likely to occur. That is, the first flip-flop unit 120 is most likely to present a metastable state when the delay value is Td<7> or Td<14>.

In the embodiments of the present application, by providing the additional second flip-flop unit 130, wherein the second data input terminal of the second flip-flop unit 130 is connected to the first clock input terminal of the first flip-flop unit 120, and the second clock input terminal of the second flip-flop unit 130 is connected to the first data input terminal of the first flip-flop unit 120, the second data output terminal of the second flip-flop unit 130 can be used as a metastable state detection terminal of the first flip-flop unit 120 to detect a metastable state of the first flip-flop unit 120, which has a simple structure and high detection accuracy.

In one of the embodiments, the first flip-flop unit 120 and the second flip-flop unit 130 are both D flip-flops. The D flip-flop includes 3 data ports, namely D, Q and CLK, wherein D is a data input terminal, Q is a data output terminal, and CLK is a clock input terminal. The data input terminal D of the D flip-flop can be used as the first data input terminal of the first flip-flop unit 120 and the second data input terminal of the second flip-flop unit 130; the data output terminal Q of the D flip-flop can be used as the first data output terminal of the first flip-flop unit 120 and the second data output terminal of the second flip-flop unit 130; the clock input terminal CLK of the D flip-flop can be used as the first clock input terminal of the first flip-flop unit 120 and the second clock input terminal of the second flip-flop unit 130.

Figure 3:
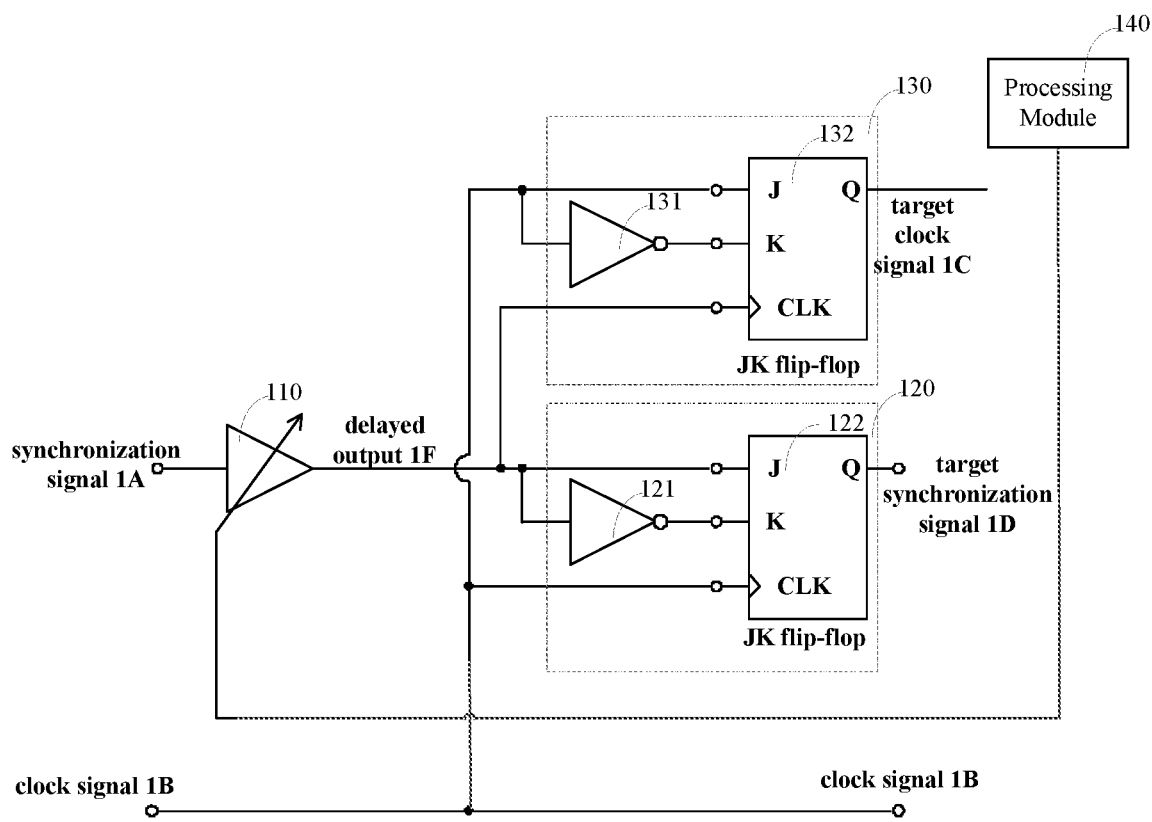
FIG. 3 is a circuit schematic of a metastable state detection device in another embodiment.

As shown in FIG. 3, in one of the embodiments, the first flip-flop unit 120 includes a first inverter 121 and a first JK flip-flop 122. The J terminal of the first JK flip-flop 122 is connected to the K terminal of the first JK flip-flop 122 via the first inverter 121. The clock terminal of the first JK flip-flop 122 is used as the first clock input terminal of the first flip-flop unit 120, and a common connection terminal of the J terminal of the first JK flip-flop 122 and the first inverter 121 is used as the first data input terminal of the first flip-flop unit 120.

The second flip-flop unit 130 includes a second inverter 131 and a second JK flip-flop 132. The J terminal of the second JK flip-flop 132 is connected to the K terminal of the second JK flip-flop 132 via the second inverter 131. The clock terminal of the second JK flip-flop 132 is used as the second clock input terminal of the second flip-flop unit 130, and a common connection terminal of the J terminal of the second JK flip-flop 132 and the second inverter 131 is used as the second data input terminal of the second flip-flop unit 130. That is, the data output terminal Q of the second JK flip-flop 132 can be used as the metastable state detection terminal of the first JK flip-flop 122 to detect the metastable state of the first JK flip-flop 122.

In this embodiment, a D flip-flop can be composed of a JK flip-flop and an inverter to realize a metastable state detection function. The specific implementation of this embodiment is identical to that of the foregoing embodiment, and will not be repeated here.

It should be noted that the first flip-flop unit 120 have a same structural formation as the second flip-flop unit 130, so as to ensure that the output signal of the first flip-flop unit 120 has a same state as that of the second flip-flop unit 130.

In one of the embodiments, the processing module 140 includes a reading unit and a controller. The reading unit is connected to the second data output terminal of the second flip-flop unit 130, and is configured to read the target clock signal 1C output from the second flip-flop unit 130. As an example, the reading unit may be a SPI reading module, which can read the target clock signal 1C output from the second flip-flop unit 130 to the controller for processing.

The controller is respectively connected to the reading unit and the delay unit 110, and is configured to detect a metastable state of the first flip-flop unit 120. As an example, the controller may be a processor of an external device that is capable of processing the target clock signal 1C, such as a CPU, a MCU, or an FPGA.

Further, the controller can also obtain a calibration delay value for calibrating the metastable state according to the target clock signal 1C, and is also configured to control the delay unit 110 to delay the synchronization signal 1A by the calibration delay value. As an example, referring to FIG. 2, P407 (P414) is a metastable point of the first flip-flop unit 120. A farthest point from the two metastable state points P407 and P414 is the midpoint P410 between them. Further, P403 is also a point farthest from the metastable state P407. Accordingly, P410 and P407 can also be understood as points with a largest margin. The point P403 or P410 with a largest margin can be used as the calibration delay value.

Optionally, the controller can take the delay value corresponding to a position (P403 or P410) where logic "1" is changed to logical "0" to be a calibration delay value according to the level signal (P401, P402, P403, ..., P414 and etc. as shown in FIG. 2) of the target clock signal 1C output from the second data output terminal.

In one of the embodiments, the controller may set the control bits <M−1:0> of the delay unit 110 to be a fixed calibration delay value, such that the delay unit 110 can delay the synchronization signal 1A with the calibration delay value.

In this embodiment, the metastable state detection device can also obtain a corresponding correction delay value, and calibrate the metastable state of the first flip-flop unit 120 according to the calibration delay value, so as to remove the metastable state of the first flip-flop unit 120 and thus improve the performance of the first flip-flop unit 120.

The metastable state detection device in the above embodiment can implement the detection of a metastable state that occurs when a plurality of clock modules is synchronized. By adjusting the delay and detecting the target clock signal 1C that is output after the delay is performed, the calibration of the data synchronization is achieved. The metastable state detection device can be arranged outside an ADC, or integrated into an ADC to form an ADC with a metastable detection function.

As an example, the metastable state detection device can be arranged within a Field Programmable Gate Array (FPGA). Both the clock signal 1B and the synchronization signal 1A of the metastable state detection device can be generated by the FPGA. The first data output terminal of the first flip-flop unit 120 can be connected to a module A within the FPGA that need to use the clock signal 1B. For example, the first data output terminal of the first flip-flop unit 120 can be connected to a reset RST signal of the module A. That is, a low frequency synchronization signal 1A can be used to sample a high frequency clock signal 1B, and the clock signal 1B can be finally recovered. When the metastable state detection device is built in the FPGA, the detection of a metastable state that occurs when a plurality of clock modules is synchronized can be implemented. By adjusting the delay and detecting the target clock signal 1C that is output after the delay is performed, the calibration of the data synchronization can be achieved.

It should be noted that, the metastable state detection device is also applicable to other electronic devices that need to synchronize a plurality of clock modules.

Figure 4:
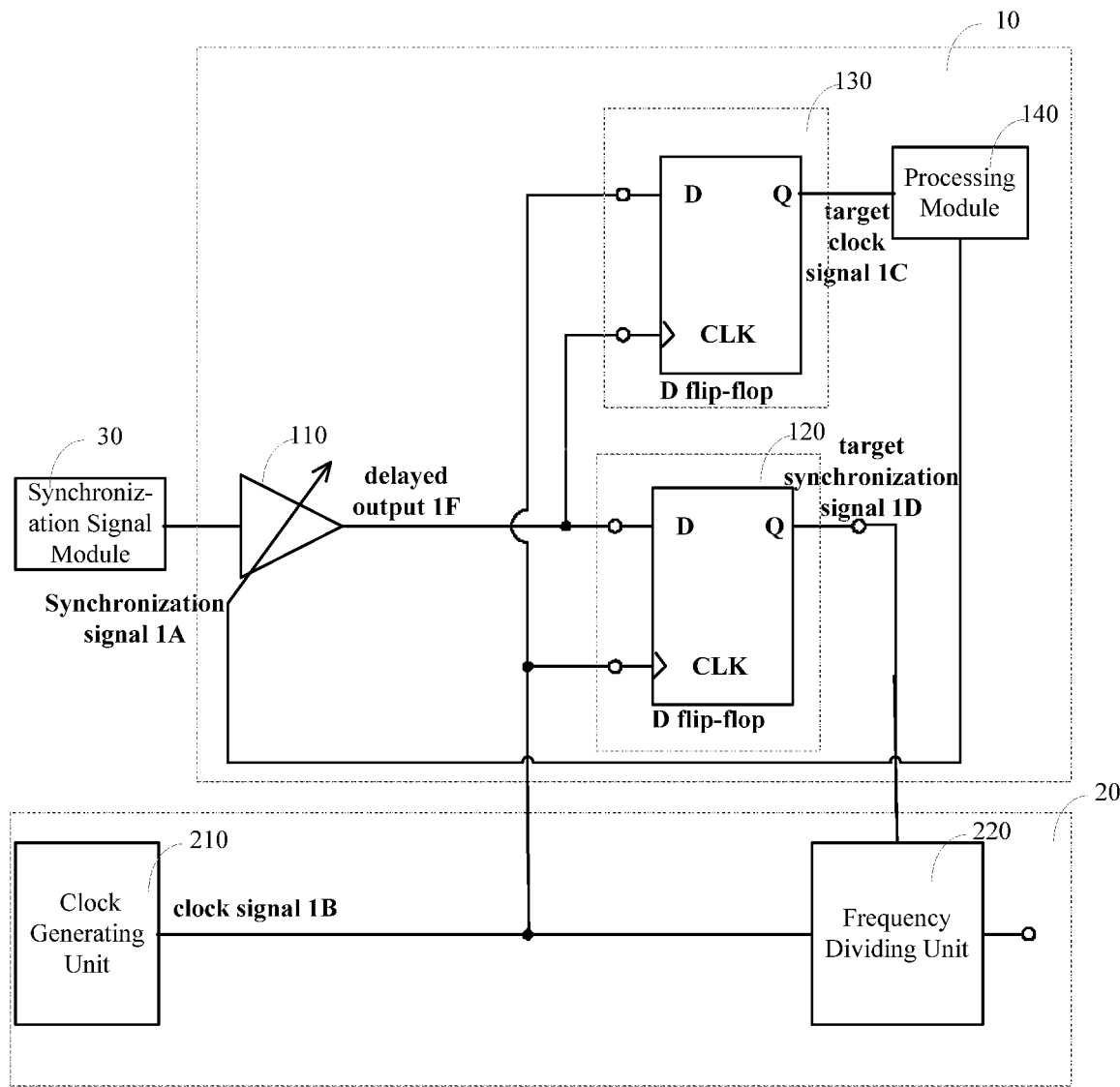
FIG. 4 is a circuit schematic of an ADC circuit in an embodiment.
Figure 5:
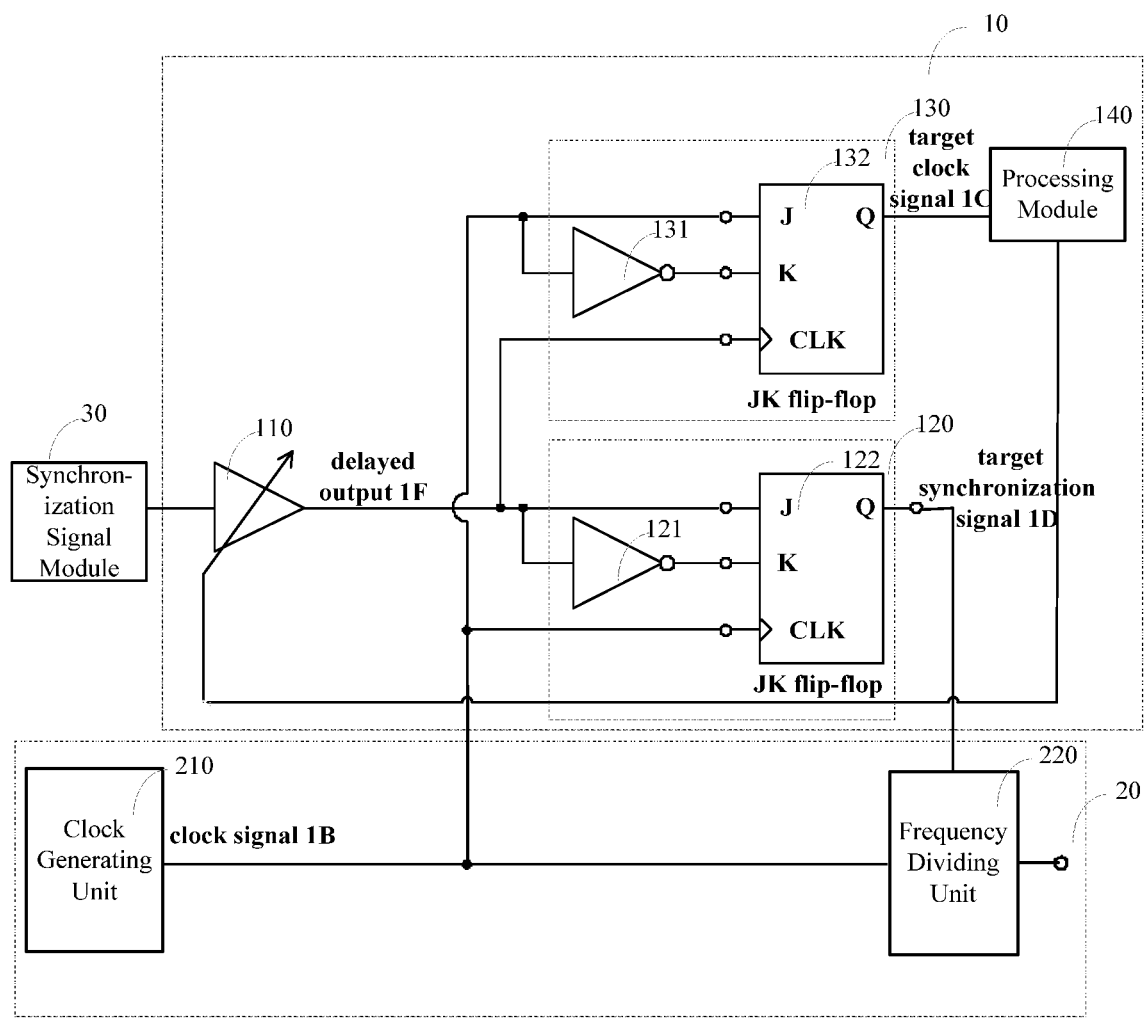
FIG. 5 is a circuit schematic of an ADC circuit in another embodiment.

As shown in FIG. 4 and FIG. 5, an ADC circuit is also provided in the embodiments of the present application. In one of the embodiments, the ADC circuit includes a clock module 20, a synchronization signal module 30, and a metastable state detection device 10 in any of the above embodiments.

The clock module 20 is configured to output a clock signal 1B.

Specifically, in one of the embodiments, the clock module 20 includes a clock generating unit 210 and a frequency dividing unit 220. The clock generating unit 210 is respectively connected to the first clock input terminal and the second data input terminal, and is configured to provide a generated clock signal 1B to the first flip-flop unit 120 and the second flip-flop unit 130; The frequency dividing unit 220 is respectively connected to the clock generating unit 210 and the first data output terminal, and is configured to perform a frequency dividing processing on a target synchronization signal 1D output from the first flip-flop unit 120.

As an example, the clock generating unit 210 may be a clock distributor with a phase-locked loop, and may output a plurality of channels of clock signals 1B. The frequency dividing unit 220 may be a frequency divider, and may perform a 4 or 8 frequency dividing processing on the target synchronization signal 1D output from the first flip-flop unit 120.

It should be noted that, in the embodiments of the present application, other devices may also be used to implement the functions implemented by the clock distributor and the frequency divider, which are not limited to the above examples.

The synchronization signal module 30 is configured to output a synchronization signal 1A.

The metastable state detection device 10 includes a delay unit 110, a first flip-flop unit 120, a second flip-flop unit 130 and a processing module 140. An input terminal of the delay unit 110 is connected to the synchronization signal module 30, and an output terminal of the delay unit 110 is respectively connected to the first data input terminal and the second clock input terminal. The first clock input terminal, the second data input terminal, and the first data output terminal are respectively connected to the clock module 20.

In this embodiment, the metastable state detection device 10 is arranged in the ADC circuit, wherein the second data input terminal of the second flip-flop unit 130 is connected to the first clock input terminal of the first flip-flop unit 120 in the metastable state detection device 10. By connecting the second clock input terminal of the second flip-flop unit 130 to the first data input terminal of the first flip-flop unit 120, the second data output terminal of the second flip-flop unit 130 can be used as the metastable state detection terminal of the first flip-flop unit 120 to detect the metastable state of the first flip-flop unit 120. As a result, the ADC circuit has a metastable detection function, and has a simple structure and high detection accuracy.

The embodiment of the application also provides a metastable state detection method. In one of the embodiments, the metastable state detection method is applicable to a metastable state detection device. As shown in FIG. 1 and FIG. 3, the metastable state detection device includes a delay unit 110, a first flip-flop unit 120, and a second flip-flop unit 130. The clock input terminal of the first flip-flop unit is connected to the data input terminal of the second flip-flop unit, both of which are configured to receive a clock signal 1B. The data input terminal of the first flip-flop unit and the clock input terminal of the second flip-flop unit are respectively connected to the delay unit, both of which are configured to receive a delayed synchronization signal 1A.

Figure 6:
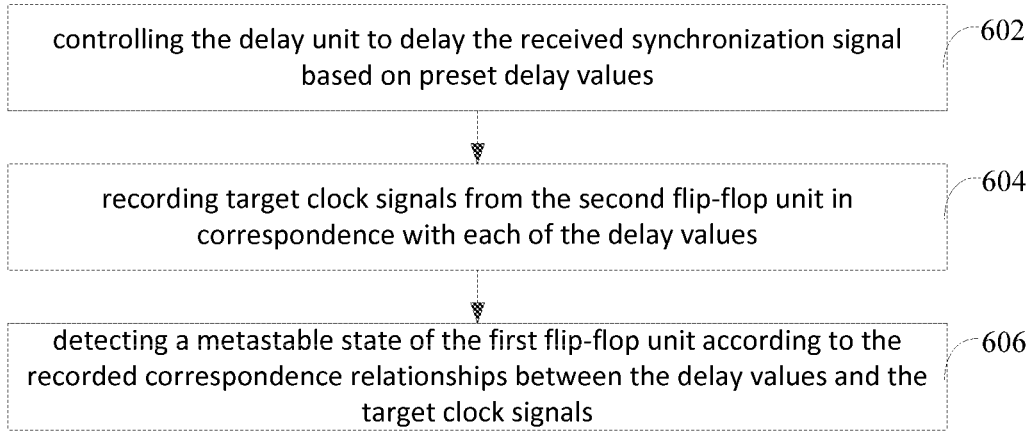
FIG. 6 is a schematic flow chart of a metastable state detection method in an embodiment.
Figure 7:
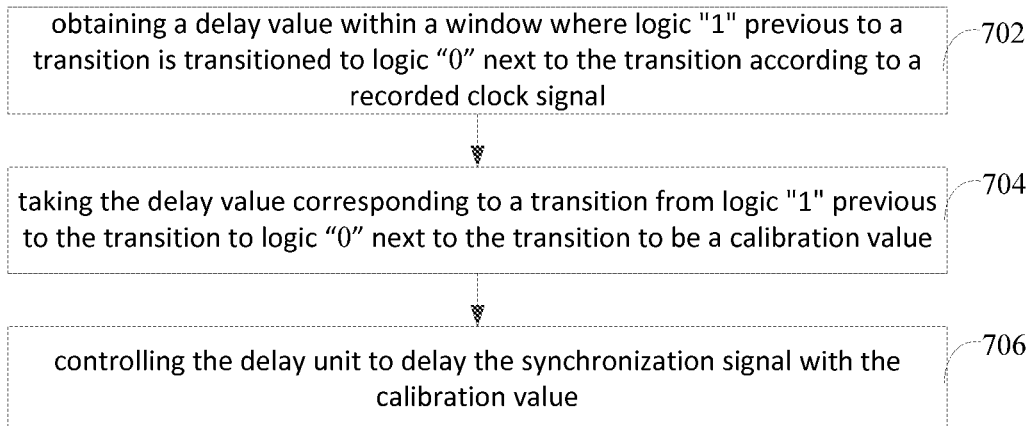
FIG. 7 is a schematic flow chart of calibrating a metastable state of the first flip-flop unit in an embodiment.

As shown in FIG. 6, the metastable state detection method includes step 602-step 606, in which:

Step 602, the delay unit is controlled to delay the received synchronization signal based on preset delay values;

In one of the embodiments, the delay unit may include a register, which is referred to as DSYNC. Control bits of the register can be set as <M−1:0>, wherein M represents the number of the control bits of the register, <M−1:0> represents that there are M control bits and 2^M register values in total. When the control value is 0, the delay value used by the delay unit 110 to perform a delay processing on the synchronization signal 1A is Td<1>; when the control value is 1, the delay value used by the delay unit 110 to perform a delay processing on the synchronization signal 1A is Td<2>, and so on. When the control value is M−1, the delay value used by the delay unit 110 to perform a delay processing on the synchronization signal 1A is Td<M>. At the same time, each delay value used by the delay unit 110 to perform a delay processing on the synchronization signal 1A is set according to a preset step. The delay value Td<1> is less than the delay value Td<2>, and the delay value Td<2> is less than the delay value Td<3>. For example, Td<1><Td<2>< . . . <Td<M−1><Td<M>.

It should be noted that the difference between any two adjacent delay values is the same. That is, Td<2>−Td<1>=Td<M>−Td<M−1>. Optionally, the difference between any two adjacent delay values may not be the same. In the present disclosure, the difference between two adjacent delay values is not further limited.

Step 604, target clock signals from the second flip-flop unit is recorded in correspondence with each of the delay values.

In one of the embodiments, DSYNC<M−1:0>=0 can be set, and a synchronization signal 1A (a SYNC pulse) can be sent to the delay unit, and a level signal of a target clock signal 1B can be tested at the second data output terminal of the second flip-flop unit. Further, a level signal P401 of the target clock signal 1C from the second data output terminal of the second flip-flop unit is recorded in correspondence with the delay value Td<1>. Correspondingly, the value of DSYNC<M−1:0> is increased by 1, that is, DSYNC<M−1:0>=1, and a level signal P402 of the target clock signal 1C from the second data output terminal of the second flip-flop unit is recorded in correspondence with the delay value Td<2>. The above process is repeated until the value of DSYNC<M−1:0> is increased by 2^M, that is, DSYNC<M−1:0>=2^M. As an example, the delay values (Td<1>, Td<2>, . . . , <Td<14> in FIG. 2) can be recorded in correspondence with the level signals (P401, P402, P403, . . . , P414, and etc. in FIG. 2) of the target clock signal 1B output from the second data output terminal can be recorded.

Step 606, a metastable state of the first flip-flop unit is detected according to the recorded correspondence relationships between the delay values and the target clock signals.

In one of the embodiments, that a metastable state of the first flip-flop unit is detected according to the recorded correspondence relationships between the delay values and the target clock signals includes the following steps.

When a rising edge or falling edge of the delayed synchronization signal 1A is input to the first flip-flop unit as a triggering edge, a target clock signal 1C is recorded; a delay value within a setup/hold time window is obtained according to the recorded target clock signal; the delay value within the setup/hold time window is used as the metastable state of the first flip-flop unit. The target clock signal 1C is used to reflect phase information of the clock signal.

Specifically, when a rising edge or falling edge of the synchronization signal 1A that has been delayed for a certain value is input to the first flip-flop unit as a triggering edge, and the output of the first flip-flop unit that reflects the phase information of the clock signal 1B is recorded, a delay value within a setup/hold time window (a window where the metastable state is most likely to occur) is used as the detected metastable state according to the relationships between the delay values and the clock phase outputs. When a rising edge of the synchronization signal 1A that has been delayed by the delay unit is used as a triggering edge of the second flip-flop unit, the correspondence relationships between the target clock signals 1C and the delay values can be obtained, and points where the first flip-flop unit presents a metastable state can be detected according to the correspondence relationships. As shown in FIGS. 2, P407 and P414 are the points where a metastable state is most likely to occur. That is, the first flip-flop unit is most likely to present a metastable state when the delay value is Td<7> or Td<14>.

In one of the embodiments, the metastable state detection method further includes a step of calibrating the metastable state of the first flip-flop unit.

Specifically, calibrating the metastable state of the first flip-flop unit includes steps 702-704.

Step 702, a delay value within a window where logic "1" is transitioned to logic "0" is obtained according to a recorded clock signal.

Step 704, the delay value corresponding to the transition from logic "1" to logic "0" is taken to be a calibration value.

Referring to FIG. 2, P407 (P414) is the metastable state point of the first flip-flop unit. A farthest point from the two metastable state points P407 and P414 is the midpoint P410 between them. Similarly, P403 is also a farthest point from the metastable state point P407. P410 and P407 can be understood as points with a largest margin, and the point P403 or P410 with a largest margin can be used as the calibration delay value.

Optionally, the controller can take the delay value that is corresponding to a position (P403 or P410) where logic "1" is transitioned to logic "0" to be a calibration delay value according to the level signal (P401, P402, P403, . . . , P414 and etc. in FIG. 2) of the target clock signal 1C output from the second data output terminal.

Step 706, the delay unit is controlled to delay the synchronization signal 1A with the calibration value.

The control bits <M−1:0> of the delay unit are set to be a fixed calibration delay value, such that the delay unit delays the synchronization signal 1A with the calibration delay value.

In one of the embodiments, when there are a plurality of calibration values, a minimum calibration value of the plurality of calibration values is selected to be the target calibration value. The control bits <M−1:0> of the delay unit is set to be the fixed target calibration value, such that the delay unit delays the synchronization signal 1A for the target calibration value. As a result, the metastable state of the first flip-flop unit is eliminated.

In this embodiment, according to the metastable state detection method, a corresponding calibration delay value can further be obtained, and the metastable state of the first flip-flop unit can be calibrated based on the calibration delay value, such that the metastable state of the first flip-flop unit is eliminated and thus the performance of the first flip-flop unit is improved.

In one of the embodiments, the metastable state detection method further includes: detecting if a clock mode of the clock signal 1B has been changed; and when the clock mode has been changed, recalibrating the metastable state of the first flip-flop unit.

Specifically, the clock mode can include single-channel mode, dual-channel mode, four-channel mode, and other modes. When the clock mode is changed, the phase of its clock signal 1B will also be changed. In this case, the metastable state of the first flip-flop unit is required to be recalibrated. For the steps of the recalibration, reference can be made to the above-mentioned steps 702 to 706, which will not be repeated herein.

In the metastable state detection method in this embodiment, when the clock mode is changed, the metastable state of the first flip-flop unit may be recalibrated to improve the performance of the first flip-flop unit.

The technical features of the above-mentioned embodiments can be combined arbitrarily. In order to provide a concise description, not all possible combinations of the various technical features in the above-mentioned embodiments are described. However, a combination of these technical features shall be considered within the scope of this specification if there is no contradiction there between. It should be noted that "in an embodiment", "for example", "as another example", etc. in this application are intended to illustrate this application with an example, but is not used to limit this application.

The above-mentioned embodiments only express several implementations of the present disclosure. Although the descriptions of these embodiments are specific and detail, these embodiments should not be understood as a limitation on the scope of the disclosure patent. It should be pointed out that, those of ordinary skill in the art shall be able to make several modifications and improvements without departing from the concept of the present disclosure, all of which are within the protection scope of the present disclosure. Therefore, the protection scope of the patent of the present disclosure should be subject to the appended claims.

What is claimed is:

1. A metastable state detection device comprising:
a delay unit which is configured to receive a synchronization signal and delay the synchronization signal;
a first flip-flop unit including a first clock input terminal, a first data input terminal and a first data output terminal, wherein the first clock input terminal is configured to receive a clock signal;
the first data input terminal is connected to the delay unit and is configured to receive the delayed synchronization signal;
a second flip-flop unit including a second clock input terminal, a second data input terminal and a second data output terminal, wherein the second clock input terminal is respectively connected to the delay unit and the first data input terminal and is configured to receive the delayed synchronization signal; the second data input terminal is connected to the first clock input terminal and is configured to receive a clock signal; the second data output terminal is configured to output a target clock signal that is synchronized with the delayed synchronization signal;
a processing module connected to the second data output terminal, which is configured to receive the target clock signal and detect a metastable state of the first flip-flop unit according to the target clock signal.

2. The metastable state detection device according to claim 1, wherein both of the first flip-flop unit and the second flip-flop unit are D flip-flops.

3. The metastable state detection device according to claim 1, wherein the first flip-flop unit includes a first inverter and a first JK flip-flop, and a J terminal of the first JK flip-flop is connected to a K terminal of the first JK flip-flop via the first inverter; the second flip-flop unit includes a second inverter and a second JK flip-flop, and a J terminal of the second JK flip-flop is connected to a K terminal of the second JK flip-flop via the second inverter.

4. The metastable state detection device according to claim 1, wherein the processing module comprises:
a reading unit connected to the second data output terminal, which is configured to read the target clock signal;
a controller respectively connected to the reading unit and the delay unit, which is configured to detect the metastable state of the target clock signal, and obtain a calibration delay value for calibrating the metastable state according to the target clock signal, and is also configured to control the delay unit to delay the synchronization signal with the calibration delay value.

5. An ADC circuit comprising:
a metastable state detection device, wherein the metastable state detection device includes:
a delay unit which is configured to receive a synchronization signal and delay the synchronization signal;
a first flip-flop unit including a first clock input terminal, a first data input terminal and a first data output terminal, wherein the first clock input terminal is configured to receive a clock signal; the first data input terminal is connected to the delay unit and is configured to receive the delayed synchronization signal;
a second flip-flop unit including a second clock input terminal, a second data input terminal and a second data output terminal, wherein the second clock input terminal is respectively connected to the delay unit and the first data input terminal and is configured to receive the delayed synchronization signal; the second data input terminal is connected to the first clock input terminal and is configured to receive a clock signal; the second data output terminal is configured to output a target clock signal that is synchronized with the delayed synchronization signal;
a processing module connected to the second data output terminal, which is configured to receive the target clock signal and detect a metastable state of the first flip-flop unit according to the target clock signal.

6. The ADC circuit of claim 5, further comprising:
a clock module which is configured to output a clock signal;
a synchronization signal module which is configured to output a synchronization signal;
wherein an input terminal of the delay unit is connected to the synchronization signal module, and an output terminal of the delay unit is respectively connected to the first data input terminal and the second clock terminal; the first clock input terminal, the second data input terminal and the first data output terminal are respectively connected to the clock generating module.

7. The ADC circuit of claim 5, wherein the clock module includes:
a clock generating unit which is respectively connected to the first clock input terminal and the second data input terminal and is configured to generate the clock signal;
a frequency dividing unit which is respectively connected to the clock generating unit and the first data output terminal, and is configured to perform a frequency dividing processing on the target synchronization signal output from the first flip-flop unit.

8. A metastable detection method, wherein the detection method is applicable to a metastable state detection device, and wherein the metastable state detection device includes a delay unit, a first flip-flop unit, and a second flip-flop unit, wherein a clock input terminal of the first flip-flop unit is connected to a data input terminal of the second flip-flop unit, both of which are configured to receive a clock signal, and wherein a data input terminal of the first flip-flop unit and a clock input terminal of the second flip-flop unit are respectively connected to the delay unit, both of which are configured to receive a delayed synchronization signal; wherein the method includes:
controlling the delay unit to delay the received synchronization signal based on preset delay values;
recording target clock signals from the second flip-flop unit in correspondence with each of the delay values;
detecting a metastable state of the first flip-flop unit according to the recorded correspondence relationships between the delay values and the target clock signals.

9. The metastable detection method according to claim 8, wherein detecting a metastable state of the first flip-flop unit according to the recorded correspondence relationships between the delay values and the target clock signals includes:
when a rising edge or falling edge of the delayed synchronization signal being input to the second flip-flop unit as a triggering edge, obtaining a delay value within a setup/hold time window according to the recorded target clock signal;
using the delay value within the setup/hold time window as the metastable state of the first flip-flop unit.

10. The metastable state detection method according to claim 8, wherein the method further comprises: calibrating the metastable state of the first flip-flop unit.

11. The metastable state detection method according to claim 9, wherein the calibrating the metastable state of the first flip-flop unit comprises:
obtaining a delay value within a window where logic "1" is transitioned to logic "0" to the recorded target clock signal;
taking the delay value within the window where logic "1" is transitioned to logic "0" as a calibration value;
controlling the delay unit to delay the synchronization signal with the calibration value.

12. The metastable state detection method according to claim 11, wherein when there are a plurality of calibration values, a minimum calibration value of the plurality of calibration values is selected to be a target calibration value.

13. The metastable state detection method according to claim 10, wherein the method further comprises:
detecting if a clock mode of the clock signal has been changed;
when the clock mode has been changed, recalibrating the metastable state of the first flip-flop unit.

14. The metastable state detection method according to claim 9, wherein the method further comprises:
detecting if a clock mode of the clock signal has been changed;
when the clock mode has been changed, recalibrating the metastable state of the first flip-flop unit.

15. The ADC circuit according to claim 5, wherein both of the first flip-flop unit and the second flip-flop unit are D flip-flops.

16. The ADC circuit of according to claim 5, wherein the first flip-flop unit includes a first inverter and a first JK flip-flop, and a J terminal of the first JK flip-flop is connected to a K terminal of the first JK flip-flop via the first inverter; the second flip-flop unit includes a second inverter and a second JK flip-flop, and a J terminal of the second JK flip-flop is connected to a K terminal of the second JK flip-flop via the second inverter.

17. The ADC circuit of according to claim 5, wherein the processing module comprises:
a reading unit connected to the second data output terminal, which is configured to read the target clock signal;
a controller respectively connected to the reading unit and the delay unit, which is configured to detect the metastable state of the target clock signal, and obtain a calibration delay value for calibrating the metastable state according to the target clock signal, and is also configured to control the delay unit to delay the synchronization signal with the calibration delay value.

18. The metastable state detection method according to claim 9, wherein the method further comprises: calibrating the metastable state of the first flip-flop unit.

* * * * *